(12) United States Patent
Mahoney et al.

(10) Patent No.: US 12,009,622 B2
(45) Date of Patent: Jun. 11, 2024

(54) RADIO FREQUENCY (RF) CONNECTOR ASSEMBLY BETWEEN COMPONENTS WITHIN A CABLE TELEVISION MODULE

(71) Applicant: Applied Optoelectronics, Inc., Sugar Land, TX (US)

(72) Inventors: William G. Mahoney, Suwanee, GA (US); Rafael Celedon, Atlanta, GA (US); Simon Farfoud, Hoschton, GA (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 378 days.

(21) Appl. No.: 17/366,851

(22) Filed: Jul. 2, 2021

(65) Prior Publication Data

US 2023/0006402 A1    Jan. 5, 2023

(51) Int. Cl.
*H01R 24/40*    (2011.01)
*H03F 3/19*    (2006.01)

(52) U.S. Cl.
CPC .............. *H01R 24/40* (2013.01); *H03F 3/19* (2013.01); *H01R 2201/18* (2013.01); *H03F 2200/451* (2013.01)

(58) Field of Classification Search
CPC .... H01R 24/40; H01R 24/52; H01R 2201/18; H03F 3/14; H03F 2200/451
See application file for complete search history.

(56) References Cited

U.S. PATENT DOCUMENTS

| | | | |
|---|---|---|---|
| 6,094,352 A | 7/2000 | Reddy et al. | |
| 6,593,830 B2* | 7/2003 | Wu | H01R 24/46 725/127 |
| 6,811,447 B2 | 11/2004 | Pfister et al. | |
| 7,625,247 B1 | 12/2009 | Mahoney et al. | |
| 8,047,872 B2* | 11/2011 | Burris | H01R 24/54 439/582 |
| 10,218,123 B1 | 2/2019 | Mahoney | |
| 10,424,424 B2* | 9/2019 | Farrell | H01B 11/1834 |
| 11,456,566 B2 | 9/2022 | Mahoney et al. | |
| 2006/0281370 A1 | 12/2006 | Mahoney et al. | |
| 2021/0218182 A1 | 7/2021 | Jacobson et al. | |

OTHER PUBLICATIONS

Amphenol [Dwg No. 531-40024-1] (Year: 2000).*
How Much Return Loss is Too Much? Rule of Thumb #12 Eric Bogatin (Year: 2014).*

* cited by examiner

*Primary Examiner* — Vanessa Girardi
(74) *Attorney, Agent, or Firm* — Grossman Tucker Perreault & Pfleger, PLLC; Norman S. Kinsella

(57) ABSTRACT

The present disclosure is generally directed to a connector assembly that includes an increased outer diameter of the connector member relative to the equivalent G-type connector and an increased inner diameter of the receptable member relative to the equivalent G-type receptacle (also referred to as a seizure nut) to achieve higher current carrying capacity and target frequency rates of up to 3.0 Ghz, for example. In one preferred example, this results in a connector assembly consistent with the present disclosure having a connector member with an outer diameter of at least 10.70 mm, and more preferably 10.76±0.01 mm, rather than the 9.4 mm diameter of existing G-type connectors. Despite this increased diameter, a seizure assembly consistent with the present disclosure can achieve a functional impedance of 75 ohms to maintain nominal signal quality.

19 Claims, 11 Drawing Sheets

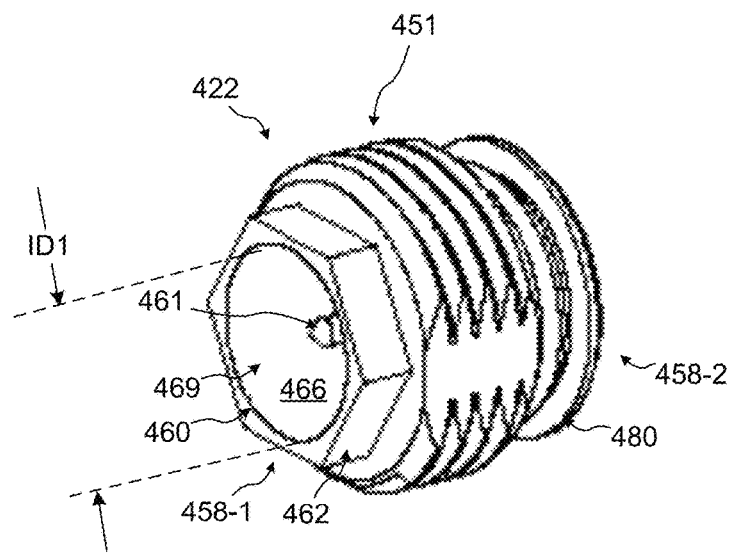
FIG. 4A
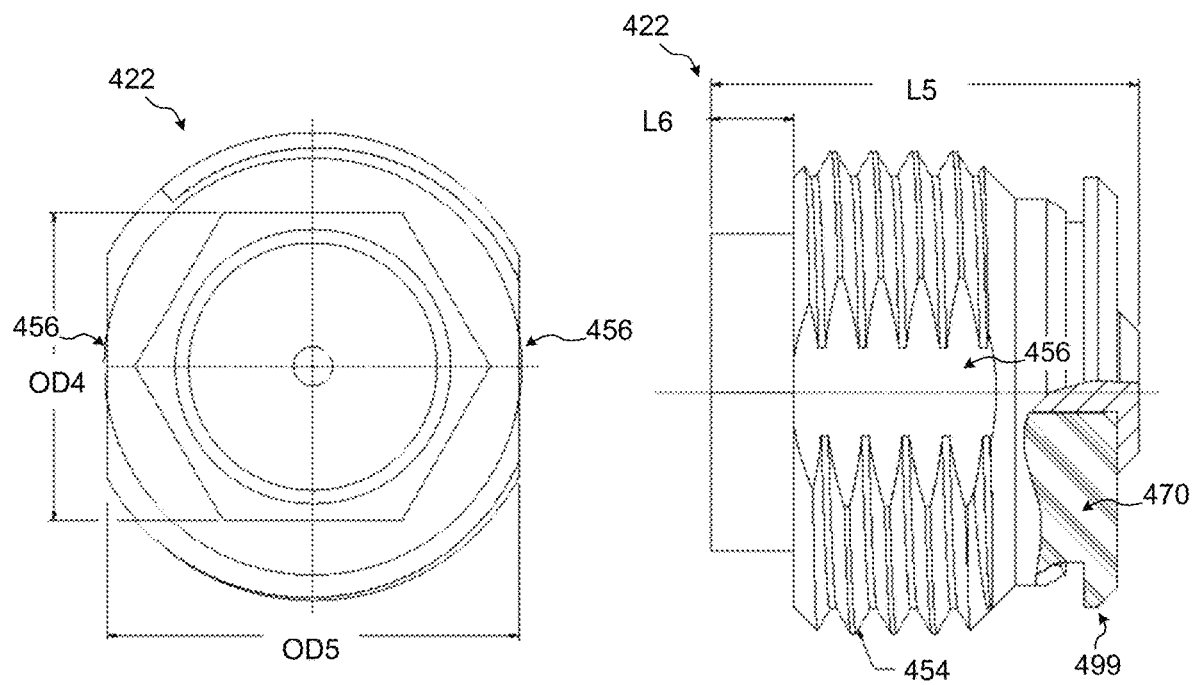
FIG. 4B  FIG. 4C

$$Z_0 = \frac{138}{\sqrt{k}} \log \frac{d_1}{d_2}$$

Where, $Z_0$ = Characteristic impedance of line
$d_1$ = Inside diameter of outer conductor
$d_2$ = Outside diameter of inner conductor
$k$ = Relative permittivity of insulation between conductors

RADIO FREQUENCY (RF) CONNECTOR ASSEMBLY BETWEEN COMPONENTS WITHIN A CABLE TELEVISION MODULE

TECHNICAL FIELD

The present disclosure relates generally to communication systems, and more particularly, to a RF connector assembly that can be used as an alternative to existing F-type and G-type connectors in components, such as cable television (CATV) nodes and amplifiers, to achieve operating frequencies greater than 1.2 GHz while preferably maintaining a target characteristic impedance, e.g., 75 Ohms.

BACKGROUND INFORMATION

Existing F-type and G-type RF connectors are utilized in a range of scenarios that seek to electrically connect circuitry within an enclosure, such as a printed circuit board (PCB), to a receptacle on the outside of the enclosure, which may also be referred to as an enclosure receptacle or jack. For example, F-type connectors include a connector member (also referred to as a PCB mount jack, a PCB mount plug, or simply a plug) and a receptacle member (also referred to as an enclosure mount jack, or simply a jack). G-type connectors are similar to F-type RF connectors, but feature slide-on/push-on capabilities to removably couple a connector member into a corresponding receptacle member.

Existing CATV nodes and amplifies, for example, utilize G-type and/or F-type RF connectors to provide a coaxial connector interface between the launch amplifier module and the weather tight enclosure. This coaxial connector interface allows for the modularity and ease of use that end-use customers require. These connectors have industry standard dimensions for the mating interface that dictates the external body diameter.

Such G-type and F-type connectors have historically worked well and provide a robust interface. However, as demand for higher current passing capability has risen over the years, the internal geometry of the connector has been adjusted/modified to include a larger conducting center pin diameter, for example. Likewise, and at the same time, the target frequency requirements have also increased from 550 MHz to present day production product of 1.2 GHz.

As new voice and data products are being developed, and particularly high-definition products, CATV devices increasingly require connectors that can achieve frequencies greater than 1.2 Ghz.

BRIEF DESCRIPTION OF THE DRAWINGS

These and other features and advantages will be better understood by reading the following detailed description, taken together with the drawings wherein:

FIG. 4A shows a perspective view of an example receptacle member suitable for use in the amplifier module of FIG. 1, in accordance with aspects of the present disclosure.

FIG. 4B shows a front view of the example receptacle member of FIG. 4A, in accordance with aspects of the present disclosure.

FIG. 4C shows a side view of the example receptacle member of FIG. 4A, in accordance with aspects of the present disclosure.

DETAILED DESCRIPTION

Figure 1:
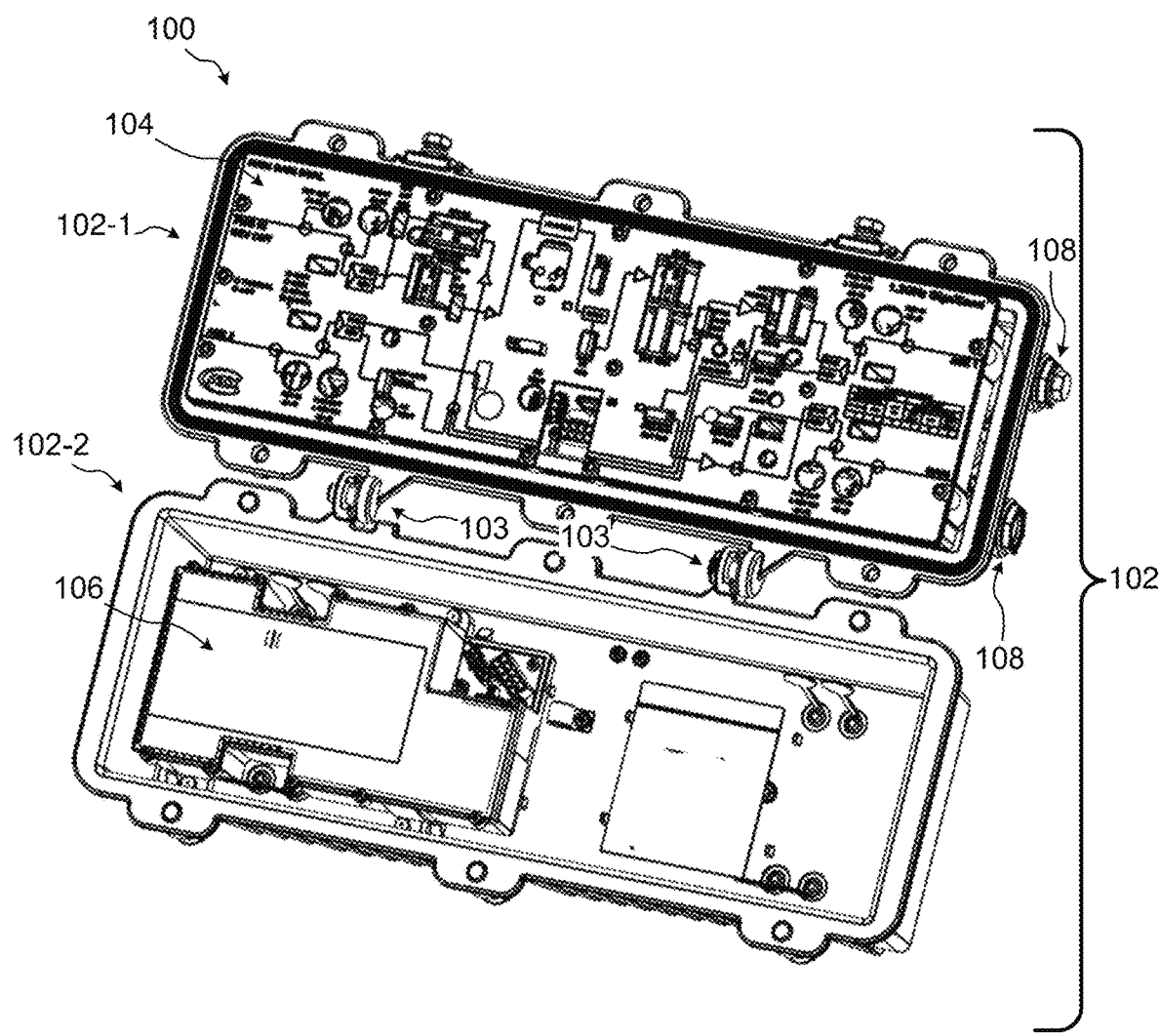
FIG. 1 shows an example amplifier module for use in a CATV network, in accordance with aspects of the present disclosure.

Existing connectors for use within CATV devices, such as the G-type and F-type connectors, struggle to exceed 1.2 Ghz service, let alone the future requirements of 3.0 Ghz service. This limitation is largely attributed to the physical geometry of G-type and F-type connectors that impact controlled characteristic impedance. For example, connector designers have remained within the external/outer dimensional standard of the G-type connector, and to achieve ever-greater frequencies, designers have increased the internal diameter of the G-type connector to an extent that that strength and structural integrity is sacrificed by virtue of the relatively thin body walls.

End customers, namely cable TV and internet providers, already have thousands of existing CATV nodes and amplifiers installed in the field, and the removal and replacement of such CATV devices is impractical. Removal requires severing a node or amplifier out of the network (e.g., physically detaching the node/amplifier from the CATV network), which results in significant down time and expense. An aim of the present disclosure is to maintain the modularity of a removable CATV device, which has long been the advantage of the G-type connector interface.

One aim of the present disclosure is therefore to avoid severing the coax connection to a CATV device housing/enclosure in order to maintain the hardline network coaxial cable connection. Likewise, requiring external modification of existing CATV device housings to accommodate coaxial connectors with enlarged, non-standard dimensions is impractical as this would require replacement of potentially thousands, or tens of thousands, of existing CATV enclosures to achieve production frequencies beyond 1.2 GHz.

Thus, the present disclosure is generally directed to an RF connector assembly that includes an increased outer diameter of the connector member relative to the equivalent G-type connector and an increased inner diameter of the receptacle member relative to the equivalent G-type receptacle (also referred to herein as a seizure nut) to achieve higher current carrying capacity (e.g., 15 Amps (A) minimum continuous and 25 A for two hours) and target production frequency rates. Preferably, a connecter assembly consistent with the present disclosure can achieve production frequencies of at least 1.8 Ghz, and more preferably, 1.8-3.0 Gh. In one preferred example, this results in an RF connector assembly consistent with the present disclosure having a connector member with a mating section that includes an outer diameter of at least 10.70 mm, and more preferably 10.76±0.01 mm, rather than the 9.4 mm diameter of the mating sections of existing G-type connectors. Likewise, an RF connector assembly consistent with the present disclosure has a receptacle member that provides a receptacle with an inner diameter equal to or less than the outer diameter of the mating section of the corresponding connector member to enable a friction/push fit.

Note, this disclosure has identified that increased dimensional changes for RF connector assemblies enables greater current carrying capacity and production performance in excess of 1.2 Ghz. However, the present disclosure has further identified that in some scenarios signal quality, such as return loss, can fall below acceptable power thresholds based on the dimensional changes negatively impacting impedance characteristics for the RF connector assembly. Thus, the present disclosure has identified that an RF connector assembly consistent with the present disclosure can utilize increased connector dimensions as well as specific materials and material configurations to achieve a functional impedance equivalent to a target impedance characteristic, e.g., 75 ohms. One such example configuration includes utilizing polymer materials such as polymethylpentene, polyoxymethylene (POM), and Polytetrafluoroethylene for the dielectric insulator (also referred to herein as simply an insulator) of the RF connector assembly and plastics for the dielectric constant. Alternatively, or in addition, such target impedance characteristics may be achieved by introducing structural changes to the insulator of the receptacle member such as air voids to adjust characteristic impedance, as will be discussed further below.

Accordingly, an RF connector assembly consistent with the present disclosure can achieve, for instance, 1.8-3.0 Ghz production performance while maintaining nominal signal power (e.g., return loss at or below −25 dB, and more preferably at or below −30 dB), as will be discussed in greater detail below with regard to the experimental results shown in FIGS. 8-10. In addition, an RF connector assembly consistent with the present disclosure can be advantageously used as a field upgrade for existing F-type and/or G-type connectors without necessarily requiring severing of a CATV node/amplifier from the CATV network to perform the upgrade, and without requiring modification of the external enclosure of the CATV node/amplifier to achieve production frequencies beyond 1.2 Ghz.

The term "coupled" as used herein refers to any connection, coupling, link or the like between elements. Such "coupled" elements are not necessarily directly connected to one another and may be separated by intermediate components.

The term substantially, as generally referred to herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/target characteristic. To provide one non-limiting numerical example to quantify "substantially," such a modifier is intended to include minor variation that can cause a deviation of up to and including ±5% from a particular stated quality/characteristic unless otherwise provided by the present disclosure.

Figure 2:
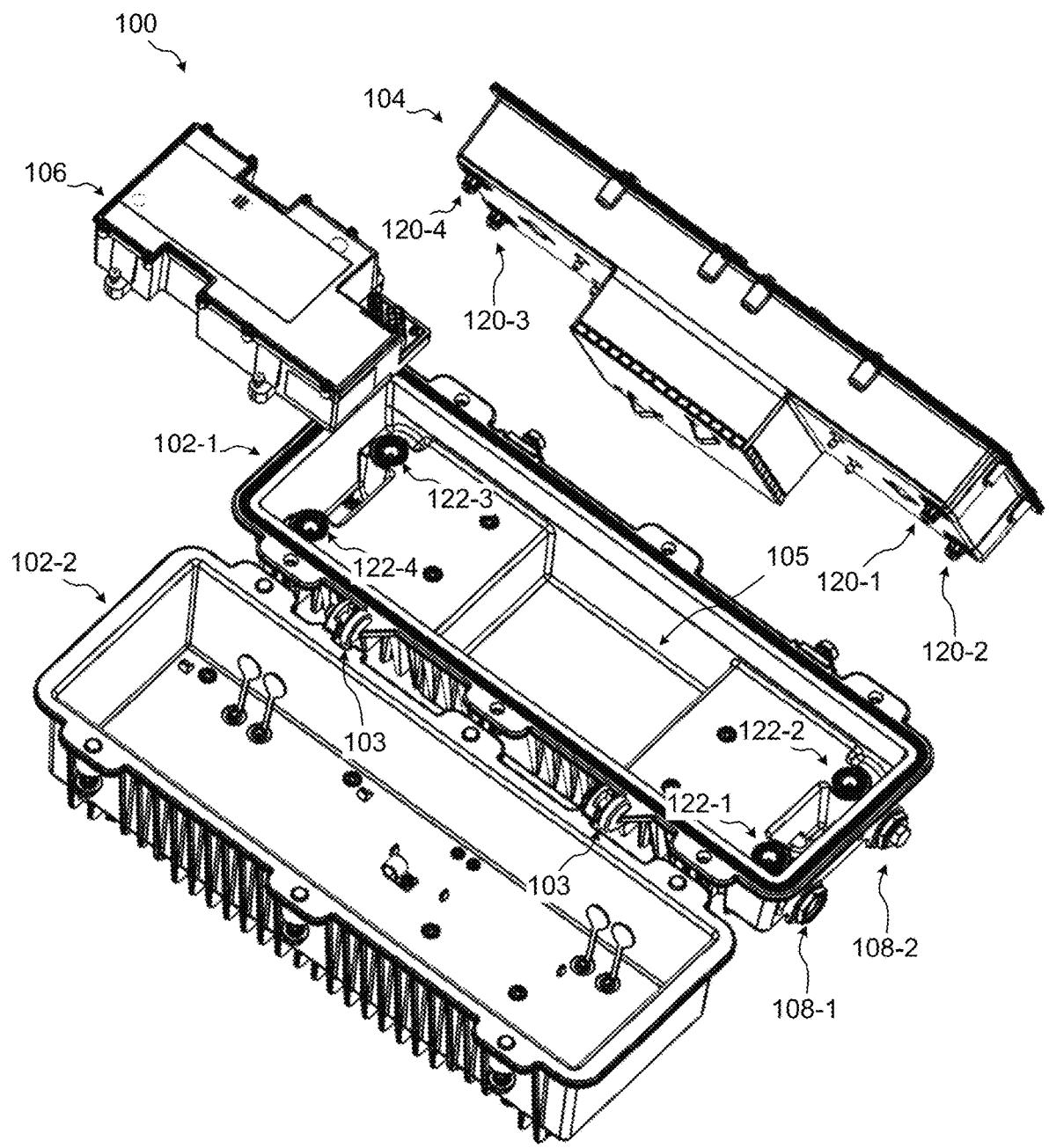
FIG. 2 shows a partially exploded view of the amplifier module of FIG. 1, in accordance with aspects of the present disclosure.

FIGS. 1-2 show an example CATV amplifier 100 for use in a CATV network, in accordance with aspects of the present disclosure. As shown, the CATV amplifier 100 includes a housing shown collectively as 102 and individual as first and second housing portions 102-1, 102-2. The housing 102 may also be referred to as an external enclosure, or simply an enclosure. The first and second housing portions 102-1, 102-2 are preferably configured to couple together and form a cavity therebetween. Preferably, the first and second housing portions 102-1, 102-2 are rotatably coupled to each other via hinges 103. The first housing portion 102-1 is further preferably configured to fixedly/securely mount to a vertical surface such as a wall or other suitable location. Accordingly, the first housing portion 102-1 can remain fixed to the mounting location while the second housing portion 102-2 can rotate relative to the first housing portion 102-1 via hinges 103 to transition between an open configuration (such as shown in FIG. 1) and closed configuration (not shown).

The housing 102 is preferably a weatherized enclosure that is configured to prevent ingress of water and dust. The housing 102 further preferably comprises a plastic such as an ultraviolet (UV) stabilized plastic, although other materials are within the scope of this disclosure. In one preferred example, the housing 102 comports with the CATV enclosure standard published as the IP68 standard.

The CATV amplifier 100 includes at least one CATV module disposed thereon. For example, and as shown, the CATV amplifier 100 includes two CATV modules, namely an amplifier module 104 disposed within the first housing portion 102-1 and a power supply module 106 disposed in the second housing portion 102-2. The amplifier module 104 may also be referred to herein as an RF module.

Note, this disclosure is not necessarily limited in this regard and other CATV module types are within the scope of this disclosure such as modules that support node operations, e.g., hybrid fiber-coaxial (HFC) transceiver modules, and power conditioning/supply circuitry. Preferably, each of the first and second housing portions 102-1 and 102-2 include a different CATV module, such as shown in FIGS. 1-2, and more preferably, the first housing portion 102-1 includes an RF module mounted therein, such as the amplifier module 104, and the second housing portion 102-2 includes a power supply module mounted therein, such as the power supply module 106.

The power supply module 106 preferably comprises one or more components/circuits such as DC-DC step-down converters, rectifiers, filters and/or other power conditioning circuitry. More preferably, the power supply module 106 is configured to output a DC voltage in a range of 35 to 90 volts for use by the amplifier module 104.

Preferably, the amplifier module 104 remains coupled to the first housing portion 102-1 and the power supply module 106 remains coupled to the second housing portion 102-2 when the housing 102 is transitioned to an open configuration, e.g., when the first and second housing portions 102-1, 102-2 are rotated away from each other via the hinges 103.

The housing 102 further preferably includes at least one coaxial seizure assembly, which may also be referred to herein as coaxial enclosure receptacles. For example, and as shown in FIG. 2, the housing 102 includes at least first and second coaxial seizure assemblies 108-1, 108-2 disposed at a distal end of the first housing portion 102-1. Each coaxial seizure assembly preferably includes a receptacle, also referred to herein as a coaxial enclosure receptacle, to removably couple to a coaxial cable (not shown) and electrically couple to an electrical conductor of the coaxial able.

Each of the coaxial seizure assemblies 108 further preferably includes a receptacle member consistent with the present disclosure. For example, and as shown, the first seizure coaxial assembly 108-1 includes a first receptacle member 122-1 disposed within a cavity 105 defined by the first housing portion 102-1. Likewise, the second coaxial seizure assembly 108-2 preferably includes a second receptacle member 122-2 disposed within the cavity 105 defined by the first housing portion 102-1.

Each coaxial seizure assembly 108 thus preferably includes fixed electrical coupling between respective coaxial receptacles provided external to the housing 102 and receptacle members disposed within the housing 102. Note, additional receptacle members such as a third and a fourth receptacle member 122-3, 122-4 may also be disposed in the cavity 105 to provide electrical conductivity between additional external coaxial enclosure receptacles (not shown).

As further shown in FIG. 2, the amplifier module 104 preferably includes at least one connector member consistent with the present disclosure. More preferably, and as shown, the amplifier module 104 includes a plurality of connector members. In the example of FIG. 2, this includes a first connector member 120-1, a second connector member 120-2, a third connector member 120-3, and a fourth connector member 120-4. Each of the connector members 120-1 to 120-4 preferably include a mating section that extends from the enclosure of the amplifier module 104 and towards the first housing portion 102-1, such as shown in FIG. 2. The mating section of each of the connector members 120-1 to 120-4 further preferably aligns with respective ones of the respective receptacle members 122-1 to 122-4.

Thus, the amplifier module 104 may be inserted into the cavity 105 of the first housing portion 102-1 and each mating section of the connector members 120-1 to 120-4 may be received into receptacles of the respective receptacle members 122-1 to 122-4 to physically and electrically couple the amplifier module 104 to the plurality of coaxial seizure assemblies, e.g., the first and second coaxial seizure assemblies 108-1, 108-2. More specifically, circuitry within the enclosure of the amplifier module 104 can electrically couple to the conductor pin of one or more coaxial cables coupled to the first and/or second coaxial seizure assemblies 108-1, 108-2 by way of the first and second receptacle members 122-1, 122-2, respectively, and corresponding first and second connector members 120-1, 120-2. More preferably, this electrical conductivity is provided by virtue of the connector members removably electrically coupling to respective ones of the receptacle members when the amplifier module 104 gets inserted into the cavity 105 of the first housing portion 102-1.

Preferably, each of the receptacle members such as the first and second receptacle members 122-1, 122-2 are securely/fixedly attached to an inner surface of the first housing portion 102-1 that defines the cavity 105. Likewise, each of the connector members such as the first and second connector members 120-1, 120-2 are securely/fixedly attached to the outer surface of the enclosure of the amplifier module 104 and/or a PCB within the same. Accordingly, the receptacle members are preferably configured to remain coupled to the first housing portion 102-1 and the connector members are preferably configured to remain coupled to the amplifier module 104 in response to the amplifier module 104 being decoupled/removed from the cavity 105 of the first housing portion 102-1.

Figure 3A:
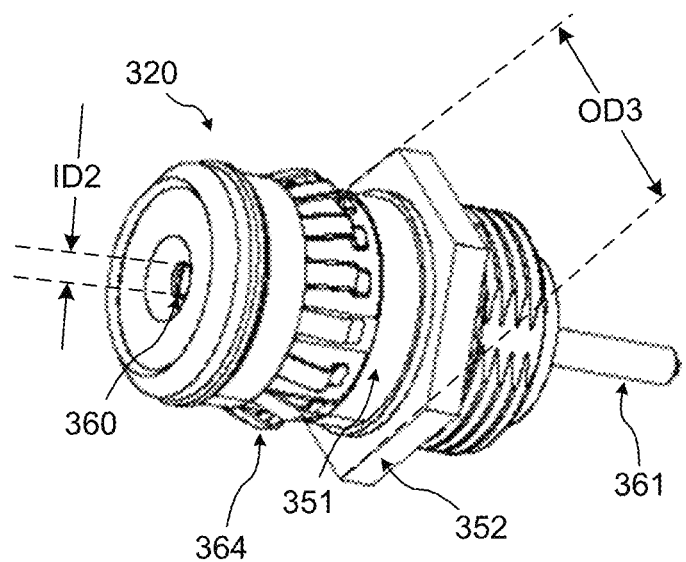
FIG. 3A shows a perspective view of an example connector member suitable for use in the amplifier module of FIG. 1, in accordance with aspects of the present disclosure.
Figure 3B:
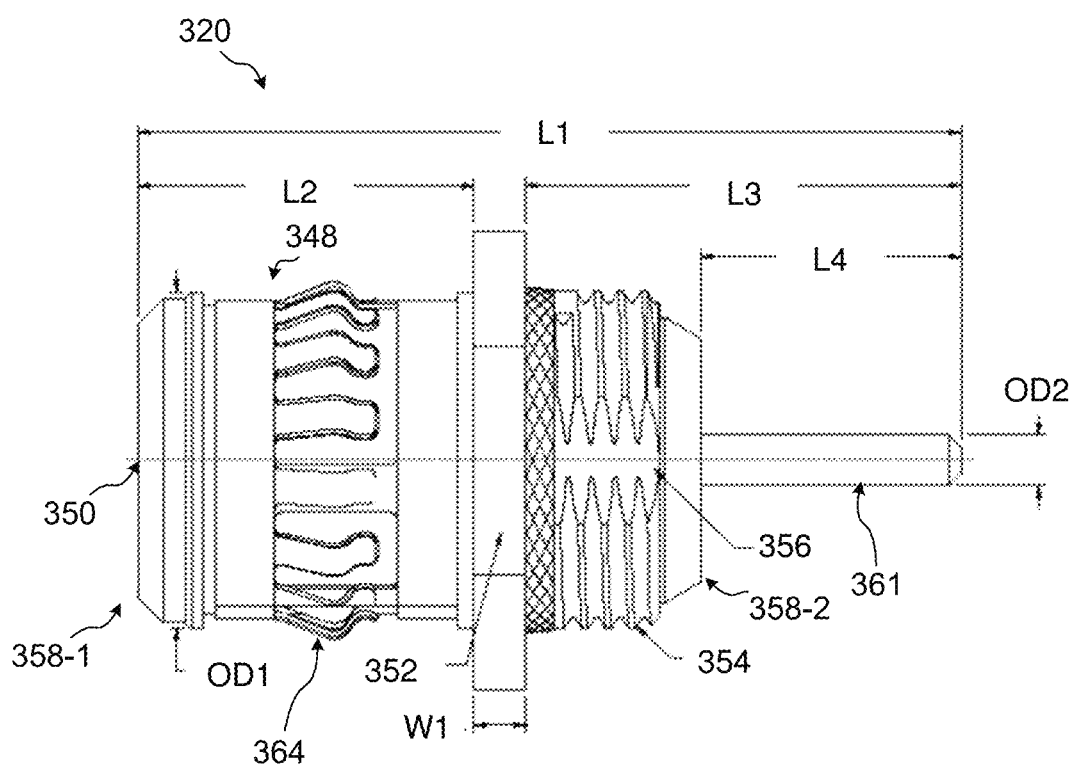
FIG. 3B shows a side view of the connector member of FIG. 3A, in accordance with aspects of the present disclosure.

Turning to FIGS. 3A-3B, an example connector member 320 is shown in accordance with aspects of the present disclosure. The connector member 320 may be implemented as any one of the connector members, e.g., connector members 120-1 to 120-4, shown in the CATV amplifier 100 shown in FIGS. 1-2.

As shown, the connector member 320 preferably includes a body 351 that extends from a first end 358-1 to a second end 358-2 along longitudinal axis 350 (See FIG. 3B). The first end 358-1 preferably defines a mating section 348, and the second end 358-2 preferably includes an electrical conductor 361 extending therefrom. The body 351 preferably comprises a metal cladding formed from a metal such as brass or zinc. In one preferred example, the body 351 comprises tin plating/cladding disposed over nickel sulfamate plating/cladding, with the thicknesses being 0.04572 mm and 0.00127 mm, respectively.

The body 351 preferably has a cylindrical shape such as shown in FIG. 3A. However, other shapes and profiles are within the scope of this disclosure. The body 351 further preferably includes a flange 352 extending radially therefrom. The flange 352 further preferably includes an overall outer diameter OD3 of 12.7±0.1 mm and includes a hexagonal shape to allow for a 0.50 inch/12.7 mm socket to be used when fixedly coupling the connector member 320 to an enclosure of a module, such as the enclosure of the amplifier module 104 shown in FIG. 2. The flange 352 further preferably includes an overall width W1 of 1.65±0.001 mm. Note, other shapes and dimensions for the flange 352 are within the scope of this disclosure including regular or irregular geometric shapes.

The body 351 further preferably defines threads 354 adjacent the second end 358-2 for securely coupling into a threaded hole of an enclosure. The threads 354 can also include a flat section 356, and more preferably at least two flat sections disposed on opposite sides of the body 351 relative to each other. The threads 354 are preferably disposed about an outer perimeter of the body 351 for securely coupling to a PCB and/or the enclosure of a module, and more preferably an RF module. The flange 352 can provide a mechanical stop that, once bottomed out against surfaces defining the through hole of the PCB and/or the enclosure of the module, prevents insertion of the connector member 320 into the through hole beyond a predetermined distance. Accordingly, the mating section 348 preferably extends away from the PCB and/or enclosure of the module when inserted into an associated through hole, such as shown in FIG. 2.

The mating section 348 further preferably defines an aperture 360 that includes an inner diameter ID2 in a range of 1.45 mm to 1.70 mm. More preferably, the aperture 360 has an inner diameter ID2 that is equal to or greater than the outer diameter of a conductor of a corresponding receptacle member, examples of which are discussed further below. In one preferred example, the aperture 360 includes an inner diameter ID2 configured to accept/receive a conductor pin with an outer diameter in a range of 1.45 mm to 1.70 mm. In addition, the aperture 360 is preferably in communication with a cavity (not shown) defined within the mating section 348 that is configured to allow for insertion of a conductor pin to a predetermined distance, with the predetermined distance being a range from 6.35 mm to 9.53 mm.

The mating section 348 further preferably has an overall outer diameter OD1 that is at least 10 mm, or at least 10.70 mm, or in a range of 10.70 to 10.80 mm, or 10.70±0.10 mm, or more preferably equal to 10.76±0.01 mm.

The mating section 348 further preferably includes a spring member 364 that is configured to supply a bias force against the sidewalls of a receptacle provided by a corresponding receptacle member when the mating section 348 is disposed in the same. The spring member 364 can comprise, for example, Copper Beryllium (BeCu) although other metals and/or alloys are within the scope of this disclosure.

The connector member 320 preferably includes an overall length L1 of 26.25±0.01 mm. The mating section 348 preferably includes an overall length L2 of 10.72±0.01 mm as measured from the from the flange 352 to the first end 358-1 of the body 351. The electrical conductor 361 preferably extends from the flange 352 to an overall length L3 of 13.88±0.25 mm and to an overall length L4 of 8.31±0.01 mm from the second end 358-2 of the body 351. The electrical conductor 361 preferably includes an outer diameter OD2 of 1.63±0.01 mm.

Note, the body 351 of the connector member 320 can include an electrical insulator (not shown), such as polytetrafluoroethylene or other suitable material, disposed therein.

In one preferred example, the connector member 320 is configured to provide characteristic impedance of 75 Ohms, and 15 amps of continuous current at 60 Hz, 75±15 VRMS square wave with an ambient temperature of 100 degrees Celsius without catastrophic failure. More preferably, the connector member 320 is configured to provide an impedance of 75 ohms and 30 amps of continuous current for 15 minutes at 60 Hz, 75±15 VRMS square wave with an ambient temperature of 100 degrees Celsius without catastrophic failure.

The connector member 320 is further preferably configured to operate at a DC production frequency of up to 3.0 GHz.

FIGS. 4A-4C show an example receptacle member 422 suitable for use as any one of the receptacle members in the CATV amplifier 100 of FIGS. 1-2.

As shown, the receptacle member 422 includes a body 451 having a first end 458-1 disposed opposite a second end 458-2. The body 451 preferably comprises, for example, brass or other suitable metal. More preferably, the body 451 comprises brass with a tin plating/cladding disposed thereon. The body 451 preferably includes a cylindrical shape as shown, although other shapes/profiles are within the scope of this disclosure.

The first end 458-1 is preferably configured to be inserted into a through hole of, for example, an enclosure/housing, such as the housing 102 shown in FIGS. 1-2. The receptacle member 422 further preferably includes threads 454 about an outer perimeter of the body 451 to provide a mounting section for securely coupling to the enclosure/housing. The mounting section further includes flat sections 456 disposed on opposite sides of the body 451. Note, the body 451 may not necessarily include threads to provide the mounting section and other configurations are within the scope of this disclosure.

The receptacle member 422 can also include flange 480 disposed adjacent the second end 458-2 that extends radially from the body 451. The flange 480 can provide a mechanical stop that, once bottomed out against surfaces defining the through hole of the housing/enclosure, prevents insertion of the receptacle member 422 into the through hole beyond a predetermined distance. Accordingly, the first end 458-1 preferably extends into the cavity 105 (See FIG. 2) defined by the first housing portion 102-1 when coupled to the same.

The body 451 of the receptacle member 422 further preferably defines an aperture 460 disposed adjacent the first end 458-1. The aperture 460 is preferably in communication with a cavity 469, with the aperture 460 and receptacle 466 collectively providing a receptacle 466 for receiving the mating section of a corresponding connector member, such as the mating section 348 of the connector member 320 (See FIG. 3B). To this end, the receptacle 466 preferably includes an inner diameter ID1 that corresponds with the outer diameter of the mating section of a corresponding connector member, e.g., the outer diameter OD1 of the mating section 348 of the connector member 320. Accordingly, the various example outer diameter measurements for the mating section 348 of the connector member 320 provided above with regard to FIGS. 3A-3B are equally applicable to the inner diameter of the aperture 460 and receptacle 466. Preferably, the aperture 460 includes an diameter ID1 that is equal to or greater than the outer diameter of the mating section of the corresponding connector member such that a friction fit gets formed therebetween. In one example, the inner diameter ID1 is preferably at least 10 mm, at least 10.70 mm, or more preferably, equal to 10.76±0.01 mm.

As further shown in FIG. 4A, an electrical conductor 461 is disposed in the receptacle 466 and is configured to be received within an aperture of a connector member, such as the aperture 360 of the connector member 320. The electrical conductor 461 can electrically couple to an electrical conductor of a corresponding connector member based on the mating section of the connecting member being inserted into the aperture 460 of the receptacle member 422. The electrical conductor 461 preferably comprises a metal such as brass, or more preferably, brass with a silver plating/cladding disposed thereon. The electrical conductor 461 preferably includes an overall outer diameter that corresponds to the inner diameter of the aperture of a corresponding connector member. In one preferred example, the outer diameter of the electrical conductor 461 is in a range of 1.45 mm to 1.70 mm.

The receptacle 466 is preferably further defined at least in part by a lip shown as a hexagonal projection 462 in FIG. 4A. The hexagonal projection 462 can be utilized to securely couple the receptacle member 422 to an enclosure, for example, using a hex socket. The hexagonal projection 462 preferably includes an outer diameter OD4 of 12.56 mm to allow for a 0.50 inch/12.7 mm socket to slide over the same, for example.

As further shown by a section of the outer portion/cladding of the body 451 being removed in FIG. 4C, the body 451 further preferably includes an electrical insulator 470 disposed therein. The electrical insulator 470 preferably comprises at least a first electrically insulating medium such as an acetal resin sold under the brand name Delrin® by Dupont. As shown, the electrical insulator 470 preferably includes a shoulder portion 499 that radially extends outwards from the body 451 within the flange 480. The shoulder portion 499 is preferably disposed adjacent the base of the electrical conductor 461 at the second end 458-2 of the body 451 to reduce the potential for electrical arcing between the electrical conductor 461 and the metal cladding that defines the outer surfaces of the body 451.

The overall outer diameter OD5 of the receptacle member 422 as measured between the flat sections 456 is preferably 16.76±0.01 mm. And the associated threading is preferably 3/14-16 unified national fine (UNF) threading. The overall length L5 of the receptacle member 422 is preferably 16.80±0.01 mm. The overall length L6 that the hexagonal projection 462 extends from the mounting section of the body 451 is preferably 3.30±0.01 mm.

Figure 6:
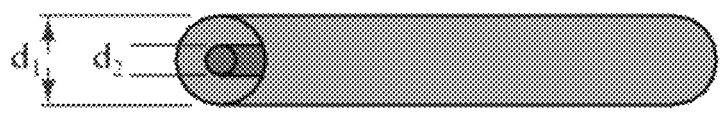
FIG. 6 shows an example approach for determining the characteristic impedance of a transmission line.

This disclosure has recognized that having an increased inner diameter ID1 (e.g., at least 10 mm) for the receptacle 466 (and by extension the outer diameter of the mating section of a respective connector member) relative to existing G-type and F-type RF connectors can introduce signal degradation due to resulting characteristic impedance being outside of the 75 Ohm target. This can be attributed to the dimensional changes that impact characteristic impedance of coaxial lines ($Z_0$) as expressed in the formula shown in FIG. 6.

In view of the above, FIGS. 5A-5E show another example receptacle member 522 that utilizes one or more voids within a electrical insulator 570 to achieve an operational characteristic impedance of substantially 75 Ohms by decreasing the relative permittivity (k) of the electrical insulator 570. The receptacle member 522 can be configured substantially similar to that of the receptacle member 422 discussed above with regard to FIGS. 4A-4C, the features and description of which are equally applicable to the receptacle member 522 and will not be repeated for brevity.

However, the receptacle member 522 includes an electrical insulator 570 that includes at least one void, and more preferably, a plurality of voids 588 as shown. Each void of the plurality of voids 588 includes an inner diameter ID3 that measures preferably in a range of 1.58 mm to 3.175 mm, 1.58±0.01 mm, or 3.175±0.01 mm. Each void of the plurality of voids 588 can include an overall length of preferably 5 mm, or 6 mm, or 0.25+−0.25 mm. Thus, the overall volume of each void of the plurality of voids 588 is preferably in a range of 50 to 60 mm³. The volume of the plurality of voids 588 relative to the overall volume of the electrical insulator 570 is preferably a ratio of 1 to 3. Note, each void of the plurality of voids 588 can include a same or different inner diameter relative to each other, and/or a different overall length relative to each other. Thus, the overall volume of each void of the plurality of voids 588 may be the same or different depending on a desired configuration.

The plurality of voids 588 preferably include an electrically insulating medium having a different electrical resistivity relative to that of the electrically insulating medium forming the electrical insulator 570. The electrical insulator 570 may therefore be provided by at least first and second electrically insulative mediums that are different from each other. The first electrically insulating medium preferably comprises a solid such as acetal resin or other dielectric material such as Delrin®, and the second electrically insulating medium (e.g., the medium within the plurality of voids 588) preferably comprises air or an inert gas. However, note the second electrically insulating medium can comprise other mediums such as nitrogen.

Note, the electrical insulator 570 preferably includes a metal cladding disposed thereon such that at least 90% of the electrical insulator 570 is covered by the same (e.g., such as shown in in FIG. 4A), or can be exposed without a metal cladding cover such as shown in FIGS. 5A-5E.

Figure 5A:
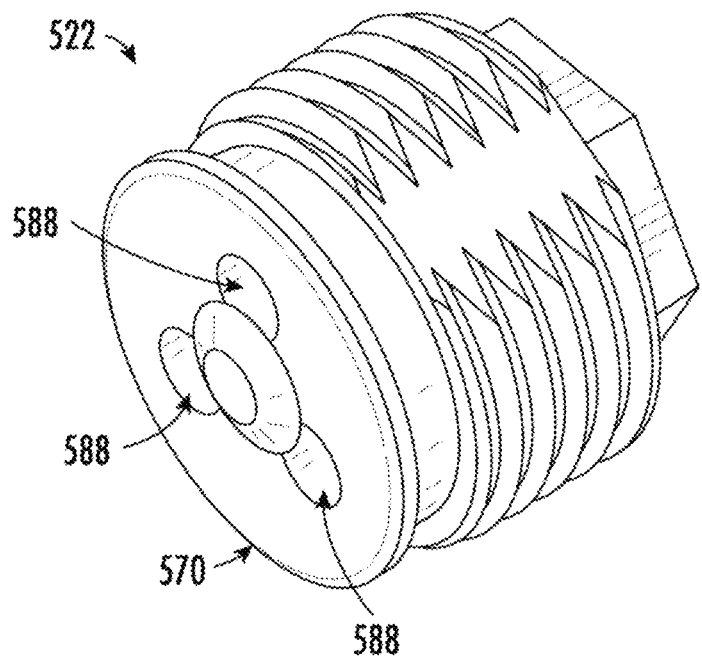
FIG. 5A shows another perspective view of an example receptacle member suitable for use in the amplifier module of FIG. 1, in accordance with aspects of the present disclosure.
Figure 5B:
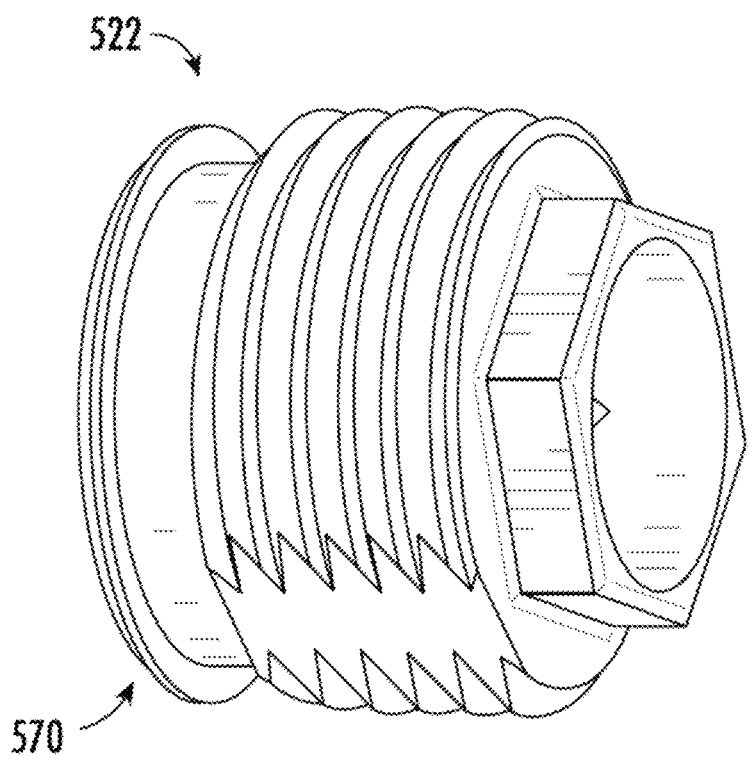
FIG. 5B shows a side view of the receptacle member of FIG. 5A, in accordance with aspects of the present disclosure.
Figure 5E:
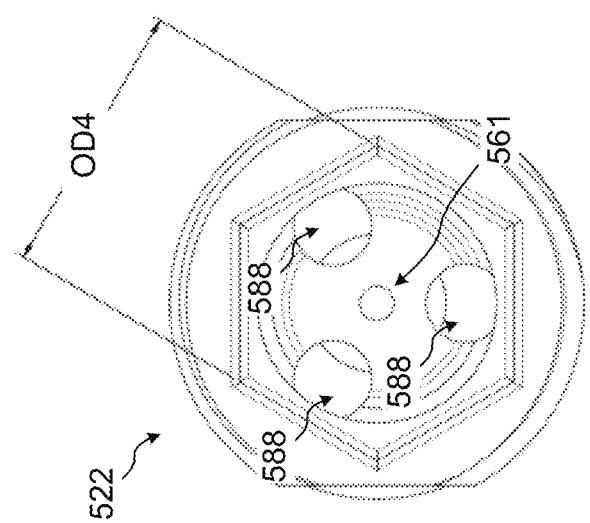
FIG. 5E shows a front view of the receptacle member of FIG. 5A in accordance with aspects of the present disclosure.
Figure 5D:
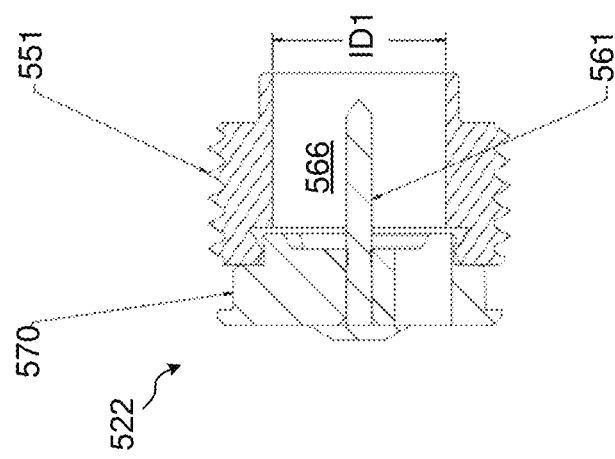
FIG. 5D shows a cross-sectional view of the receptacle member of FIG. 5A taken along the line D-D of FIG. 5C.
Figure 5C:
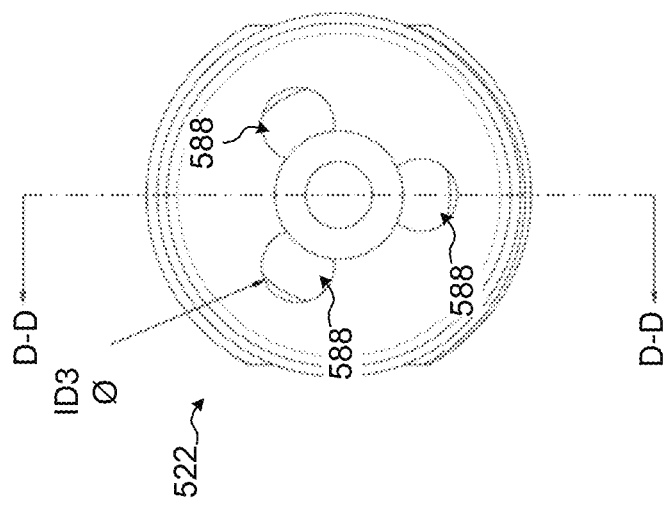
FIG. 5C shows a back view of the receptacle member of FIG. 5A, in accordance with aspects of the present disclosure.

As shown in the cross-sectional view of FIG. 5D, the electrical insulator 570 is disposed at an end of the body 551 and at least partially surrounds a distal end of the electrical conductor 561. In this example, the electrical insulator 570 is disposed between the electrical conductor 561 and a sidewall of the body 551 that defines receptacle 566. As further shown in FIG. 5E, each of the voids of the plurality of voids 588 can be implemented as through holes that extend through the electrical insulator 570.

EXPERIMENTAL RESULTS

Tests were performed for a plurality of production frequencies using a connector assembly implemented as an existing G-type connector assembly, as well as for an RF connector assembly consistent with the present disclosure. In particular, tests were performed using a receptacle member consistent with the present disclosure having a receptacle with an overall internal diameter ID1 of 10.76±0.01 mm and having a plurality of different configurations for the voids 588 (See FIGS. 5A-5E) to vary characteristic impedance.

Figure 7:
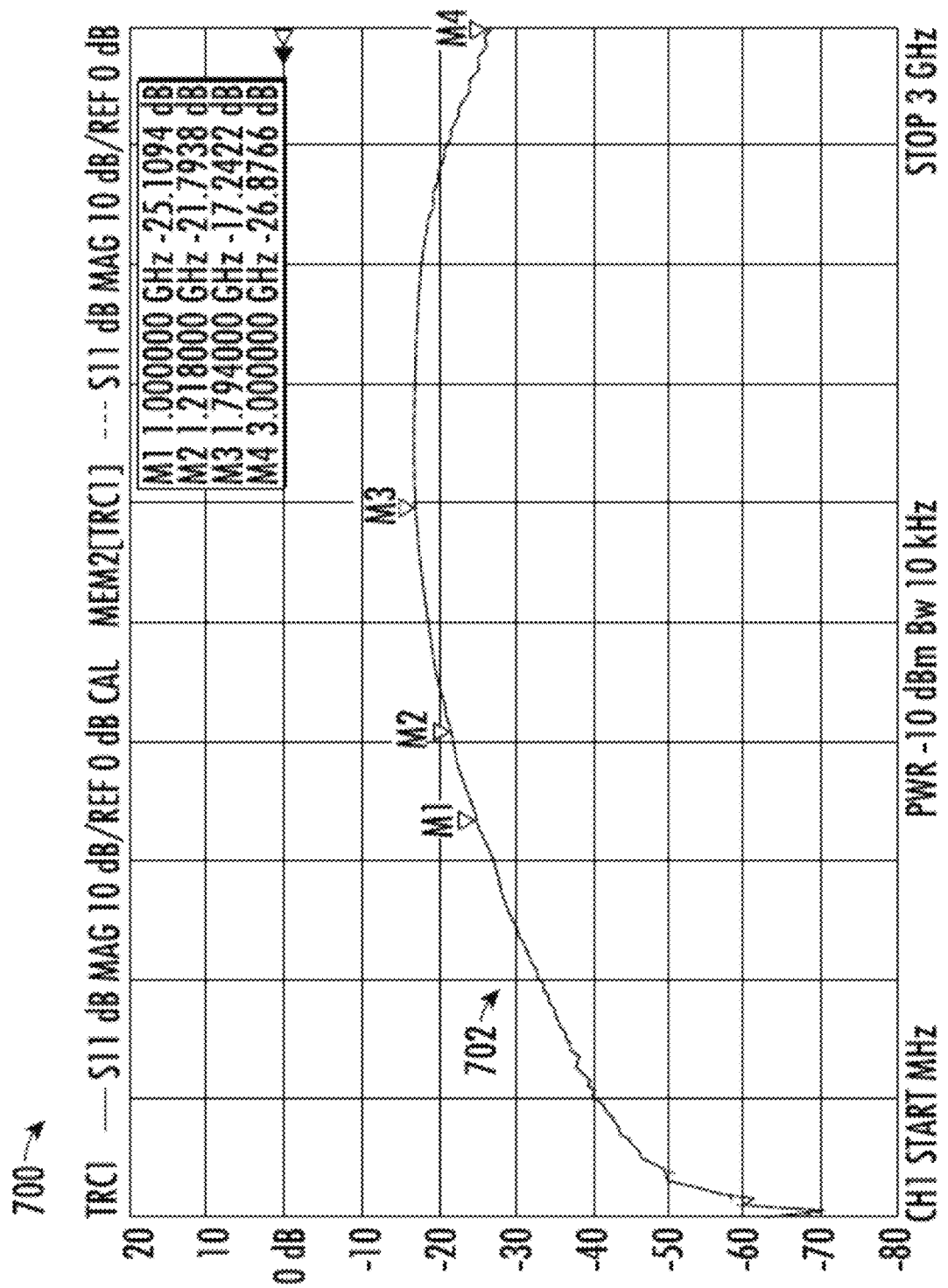
FIG. 7 shows a plot illustrating return loss for an existing G-type RF connector when operating at a plurality of production frequencies.

FIG. 7 shows a plot for a plurality of test signals passed through an existing G-type connector assembly, with the test signals having frequencies ranging from 1.0 Ghz to 3.0 Ghz to simulate a range of production frequencies. As shown, the resulting curve 702 included a measured return loss of −25.1094 dB at 1.0 GHz, −21.7938 dB at ~1.2 GHz, ~17.2422 dB at ~1.8 GHz, and −26.866 dB at 3 GHz. This experimental result showed that operation at 1.2 GHz for the existing G-type connector was marginal, and at ~1.8 GHz significantly below acceptable tolerances for real-world use. As determined through testing, the return loss is preferably kept at or below −30 dB and return loss is considered unacceptable at about −20 dB and lower for the intended CATV application.

Figure 8:
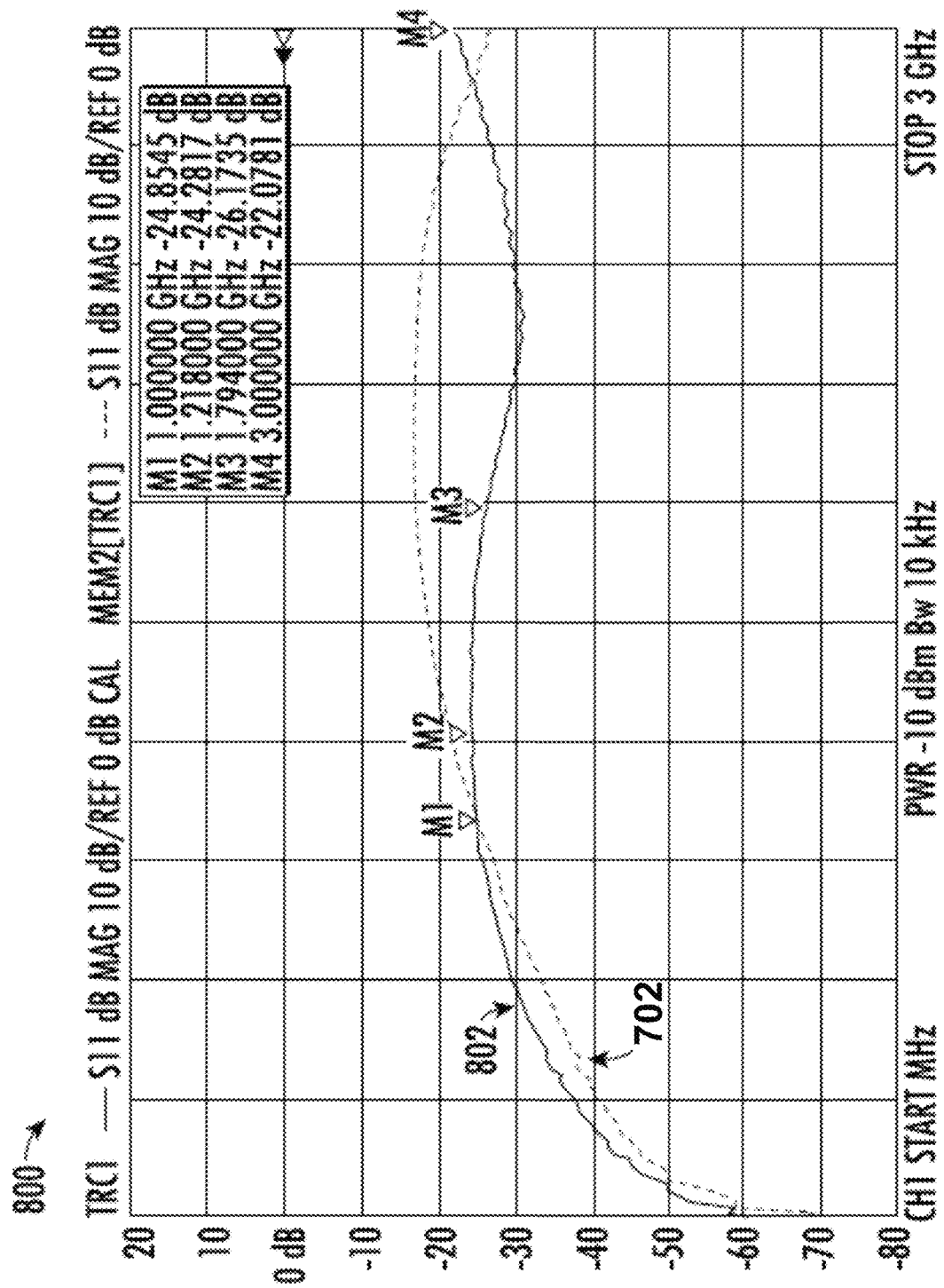
FIG. 8 shows a plot illustrating return loss for an RF connector assembly consistent with aspects of the present disclosure when operating at a plurality of production frequencies.

FIG. 8 shows a plot 800 for a plurality of test signals passed through an RF connector assembly consistent with the present disclosure, and more specifically using a receptacle member without voids introduced in an electrical insulator, e.g., using a solid electrical insulator as described above and shown in the examples of FIGS. 4A-4C. As shown in FIG. 8, the resulting curve 802 showed a return loss of −24.8545 dB at 1.0 GHz, −24.2817 dB at ~1.2 GHz, −26.1735 dB at ~1.8 GHz, and −22.0781 dB at 3.0 GHz. This experimental result showed improved performance within 1.2 Ghz and 1.8 Ghz operation relative to the results of the existing G-type connector shown in FIG. 7. The curve 702 from plot 700 of FIG. 7 is shown adjacent the curve 802 for reference.

Figure 9:
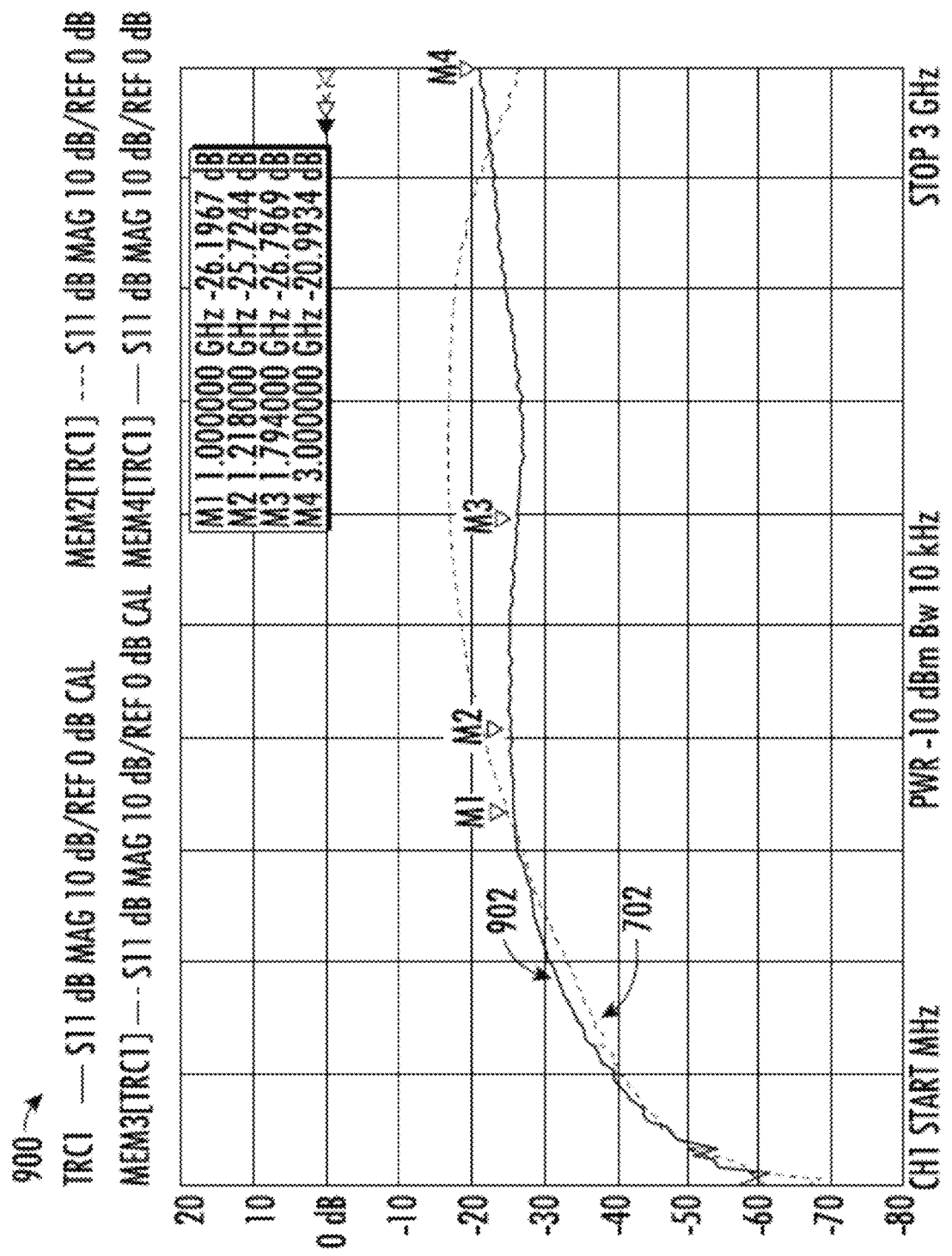
FIG. 9 shows another plot illustrating return loss for a RF connector assembly consistent with aspects of the present disclosure when operating at a plurality of production frequencies.

FIG. 9 shows a plot 900 for a plurality of test signals passed through an RF connector assembly consistent with the present disclosure, and more specifically using a receptacle member consistent with the example of FIGS. 5A-5E and having one or more voids introduced into the electrical insulator 570. In this particular example, the electrical insulator 570 included three voids each having an inner diameter of 3.6 mm and length of 6 mm.

As shown in FIG. 9, the resulting curve 902 showed a return loss of −26.1967 dB at 1.0 GHz, −25.7244 dB at ~1.2 GHz, −26.7969 dB at ~1.8 GHz, and −20.9934 dB at 3.0 GHz. This experimental result showed improved performance within 1.2 Ghz and 1.8 Ghz operation relative to the G-type connector performance indicated by curve 702, and relative to the configuration of FIG. 8 discussed above.

Figure 10:
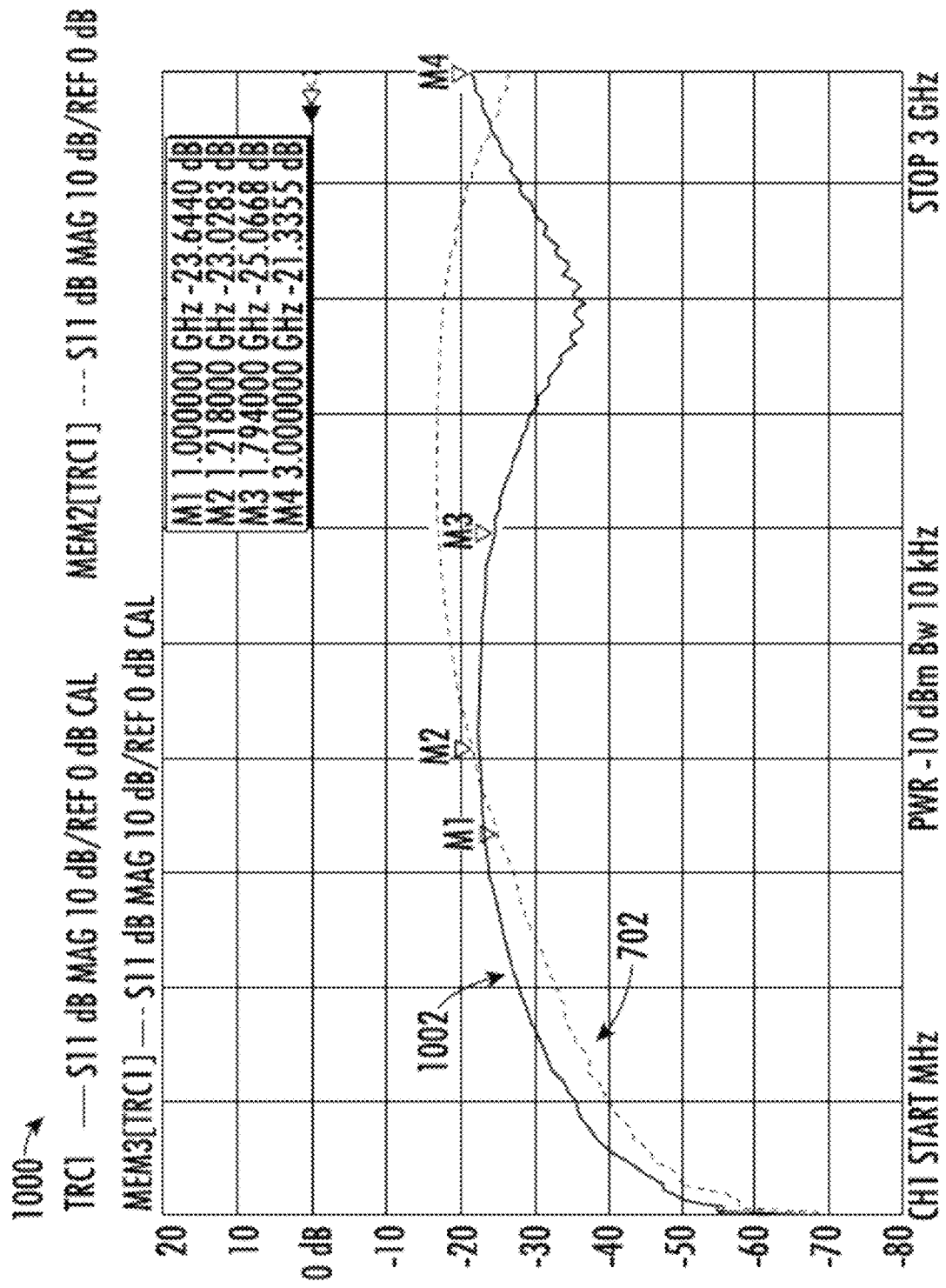
FIG. 10 shows another plot illustrating return loss for a RF connector assembly consistent with aspects of the present disclosure when operating at a plurality of production frequencies.

FIG. 10 shows a plot 1000 for a plurality of test signals passed through an RF connector assembly consistent with the present disclosure, and more specifically using a receptacle member consistent with the example of FIGS. 5A-5E and having one or more voids introduced into the electrical insulator 570. In this particular example, the electrical insulator 570 included three voids each having an inner diameter of 2 mm and length of 6 mm.

As shown in FIG. 10, the resulting curve 1002 showed a return loss of −23.6440 dB at 1.0 GHz, −23.0283 dB at ~1.2 GHz, −25.0668 dB at ~1.8 GHz, and −21.3355 dB at 3.0 GHz.

The experimental results thus showed that a receptacle member consistent with the present disclosure can be configured with or without voids in the electrical insulator, and with varying dimensions for the voids, depending on a desired operational frequency. The experimental results also showed that operating at 3.0 Ghz can be achieved via field replacement of existing G-type connectors without requiring severing of connectivity with the CATV network and/or without requiring modification to the external enclosure of CATV amplifiers/nodes.

In accordance with an aspect of the present disclosure a radio frequency (RF) connector assembly for use in a housing having a cable television (CATV) module is disclosed. The RF connector assembly comprising a connector member having a body with a mounting section to securely couple to the CATV module and a mating section, the connector member having a first electrical conductor that electrically couples to circuitry within the CATV module, a receptacle member having a body with a mounting section to securely couple to the housing and a receptacle with a second electrical conductor disposed therein to receive the mating section of the connector member and electrically couple the second electrical conductor of the receptacle member to the first electrical conductor of the connector member, and wherein the mating section of the connector member has a first outer diameter OD1 that is equal to or less than a first inner diameter ID1 of the receptacle of the receptacle member, and wherein the first outer diameter OD1 is at least 10 millimeters (mm).

In accordance with another aspect of the present disclosure a cable television (CATV) amplifier is disclosed. The CATV amplifier comprising a housing, at least a first coaxial receptacle coupled to the housing to receive and removably couple to a coaxial cable, the first coaxial receptacle further including a receptacle member disposed in the housing, the receptacle member providing a receptacle having a first inner diameter ID1, and an amplifier module disposed within the housing, the amplifier module having at least a first connector member extending therefrom, the first connector member having a mating section with a first outer diameter OD1, wherein the first connector member extends into the receptacle of the receptacle member to electrically couple an electrical conductor of the coaxial cable to circuitry of the amplifier module, and wherein the first outer diameter OD1 of the mating section of the connector member is at least 10.70 mm.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A radio frequency (RF) connector assembly for use in a housing having a cable television (CATV) module, the RF connector assembly comprising:
   a connector member having a body with a mounting section to securely couple to the CATV module and a mating section, the connector member having a first electrical conductor that electrically couples to circuitry within the CATV module;
   a receptacle member having a body with a mounting section to securely couple to the housing and a receptacle with a second electrical conductor disposed therein to receive the mating section of the connector member and electrically couple the second electrical conductor of the receptacle member to the first electrical conductor of the connector member;
   wherein the mating section of the connector member has a first outer diameter OD1 that is equal to or less than a first inner diameter ID1 of the receptacle of the receptacle member, and wherein the first outer diameter OD1 is at least 10 millimeters (mm);
   wherein the receptacle member further includes an electrical insulator disposed between the second electrical conductor and a sidewall defining the receptacle;
   wherein the electrical insulator comprises a first electrically insulating medium, at least one void, and a second electrically insulation medium;
   wherein the at least one void is disposed off-center of the electrical insulator; and
   wherein the second electrically insulating medium is disposed in the at least one void.

2. The RF connector assembly of claim 1, wherein the first outer diameter OD1 of the mating section of the connector member is 10.76±0.1 mm, or the first outer diameter OD1 is 10.76±0.01 mm.

3. The RF connector assembly of claim 1, wherein the first electrical conductor of the connector member has a second outer diameter OD2 of 1.63±0.01 mm.

4. The RF connector assembly of claim 1, wherein the second electrical conductor of the receptacle member has an overall outer diameter in a range of 1.45 mm to 1.70 mm.

5. The RF connector assembly of claim 1, wherein the electrical insulator of the receptacle member comprises an acetal resin.

6. The RF connector assembly of claim 1, wherein the first electrically insulating medium comprises a different medium than that of the second electrically insulating medium.

7. The RF connector assembly of claim 1, wherein a characteristic impedance of the RF connector assembly is 75 ohms based on the first electrically insulating medium and the at least one void.

8. The RF connector assembly of claim 1, wherein the at least one void has an inner diameter in a range of 1.58 mm to 3.175 mm.

9. The RF connector assembly of claim 1, wherein the at least one void comprises a plurality of voids having a same or different inner diameter relative to each other.

10. The RF connector assembly of claim 1, wherein the connector member has a cylindrical shape.

11. The RF connector assembly of claim 1, wherein the connector member and the receptacle member are configured to removably couple together via the receptacle of the connector member.

12. The RF connector assembly of claim 1, wherein the mating section of the connector member defines an aperture to receive the second electrical conductor of the receptacle member.

13. The RF connector assembly of claim 12, wherein the aperture of the connector member has a second inner diameter ID2 in a range of 1.45 mm to 1.70 mm.

14. The RF connector assembly of claim 1, wherein the first electrically insulating medium is a solid and the second electrically insulating medium is a gas.

15. The RF connector assembly of claim 14, wherein the second electrically insulating medium is air.

16. A cable television (CATV) amplifier, the CATV amplifier comprising:
   a housing;
   at least a first coaxial receptacle coupled to the housing to receive and removably couple to a coaxial cable, the first coaxial receptacle further including a receptacle member disposed in the housing, the receptacle member providing a receptacle having a first inner diameter ID1;
   an amplifier module disposed within the housing, the amplifier module having at least a first connector member extending therefrom, the first connector member having a mating section with a first outer diameter OD1,
   wherein the first connector member extends into the receptacle of the receptacle member to electrically couple an electrical conductor of the coaxial cable to circuitry of the amplifier module;
   wherein the first outer diameter OD1 of the mating section of the connector member is at least 10.70 mm;
   wherein the receptacle member further includes an electrical insulator disposed between the second electrical conductor and a sidewall defining the receptacle;
   wherein the electrical insulator comprises a first electrically insulating medium, at least one void, and a second electrically insulation medium;
   wherein the at least one void is disposed off-center of the electrical insulator; and
   wherein the second electrically insulating medium is disposed in the at least one void.

17. The RF connector assembly of claim 16, wherein the at least one void comprises a plurality of voids having a same or different inner diameter relative to each other.

18. The RF connector assembly of claim 16, wherein the first electrically insulating medium comprises a different medium than that of the second electrically insulating medium.

19. The RF connector assembly of claim 18, wherein the first electrically insulating medium is a solid and the second electrically insulating medium is a gas.

* * * * *